US008566105B2

(12) United States Patent
Onuma et al.

(10) Patent No.: US 8,566,105 B2
(45) Date of Patent: Oct. 22, 2013

(54) APPARATUS AND METHOD FOR ENCODING AND DECODING OF AUDIO DATA USING A ROUNDING OFF UNIT WHICH ELIMINATES RESIDUAL SIGN BIT WITHOUT LOSS OF PRECISION

(75) Inventors: Takashi Onuma, Tokyo (JP); Yasuhiro Toguri, Kanagawa (JP); Hideaki Watanabe, Tokyo (JP); Noriaki Fujita, Chiba (JP); Haifeng Bao, Tokyo (JP); Manabu Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 1297 days.

(21) Appl. No.: 11/459,513

(22) Filed: Jul. 24, 2006

(65) Prior Publication Data

US 2007/0043575 A1 Feb. 22, 2007

(30) Foreign Application Priority Data

Jul. 29, 2005 (JP) ................................ 2005-221524

(51) Int. Cl.
*G10L 19/00* (2013.01)
*G10L 21/00* (2013.01)
*G10L 19/008* (2013.01)
*G10L 19/12* (2013.01)

(52) U.S. Cl.
CPC ............... *G10L 19/008* (2013.01); *G10L 19/12* (2013.01); *H05K 999/99* (2013.01)
USPC ............................ 704/500; 704/219; 704/205

(58) Field of Classification Search
CPC ..... G10L 19/008; G10L 19/12; H05K 999/99
USPC ............................ 704/500, 229, 223; 341/50
See application file for complete search history.

(56) References Cited

U.S. PATENT DOCUMENTS

| | | | | |
|---|---|---|---|---|
| 5,794,179 | A * | 8/1998 | Yamabe | 704/205 |
| 6,675,148 | B2 * | 1/2004 | Hardwick | 704/500 |
| 7,464,027 | B2 * | 12/2008 | Schuller et al. | 704/200.1 |
| 2003/0171919 | A1 * | 9/2003 | Kim et al. | 704/229 |
| 2004/0230425 | A1 * | 11/2004 | Yu et al. | 704/223 |
| 2007/0063877 | A1 * | 3/2007 | Shmunk et al. | 341/50 |

* cited by examiner

*Primary Examiner* — Talivaldis Ivars Smits
*Assistant Examiner* — Farzad Kazeminezhad
(74) *Attorney, Agent, or Firm* — Dentons US LLP

(57) ABSTRACT

A method and apparatus for encoding audio data and a method and apparatus for decoding audio data, which can generate and decode, respectively, scalable lossless streams and which can shorten the time necessary to generate and decode lossless streams. A lossy-core encoder unit performs lossy compression on an input audio signal, generating a core stream. A simplified lossy-core decoding unit decodes only spectral signals of a specified band, e.g., a lower frequency band to generate a lossy decoded audio signal. A subtracter subtracts a lossy decoded audio signal from the input audio signal delayed to generate a residual signal. A rounding-off unit performs a process of rounding off the number of bits constituting the residual signal by eliminating the residual sign bit without loss of precision. A lossless-enhance encoder unit performs lossless compression on the residual signal to generate an enhanced stream. A stream-combining unit combines the core stream and the enhanced stream to generate a scalable lossless stream.

10 Claims, 14 Drawing Sheets

APPARATUS AND METHOD FOR ENCODING AND DECODING OF AUDIO DATA USING A ROUNDING OFF UNIT WHICH ELIMINATES RESIDUAL SIGN BIT WITHOUT LOSS OF PRECISION

CROSS REFERENCE TO RELATED APPLICATIONS

The present invention contains subject matter related to Japanese Patent Application JP 2005-221524 filed in the Japanese Patent Office on Jul. 29, 2005, the entire contents of which is incorporated herein by reference.

BACKGROUND OF THE INVENTION

1. Field of the Invention

The present invention relates to an audio-data encoding apparatus, an audio-data encoding method, an audio-data decoding apparatus, and an audio-data decoding method, each of which achieves scalability with respect to lossy compression and lossless compression.

2. Description of the Related Art

An audio-data encoding apparatuses has been proposed, which performs lossy compression on an input audio signal to generate a core stream, performs lossless compression on a residual signal to generate an enhanced stream, and combines these streams to achieve scalability with respect to the lossy compression and the lossless compression (see Patent Document 1: U.S. Patent Appln. Publication No. 2003/0171919). An audio-data decoding apparatus can decode a core stream to generate a lossy decoded audio signal, and can decode the core stream and an enhanced stream, and adds these decoded streams to generate a lossless decoded audio signal.

FIG. 1 schematically shows an example of the configuration of such an audio-data encoding apparatus used in the past. As shown in FIG. 1, the audio-data encoding apparatus 100 includes a lossy-core encoder unit 101, a lossy-core decoder unit 102, a delay-correcting unit 103, a subtracter 104, a lossless-enhance encoder unit 105, and a stream-combining unit 106.

In the audio-data encoding apparatus 100, the lossy-core encoder unit 101 performs lossy compression on an input audio signal that is a pulse-code modulation (PCM) signal to generate a core stream. The lossy-core decoder unit 102 decodes the core stream, to generate a lossy decoded audio signal. The delay-correcting unit 103 delays the input audio signal by the time the input audio signal has been delayed in the lossy-core encoder unit 101 and lossy-core decoder unit 102. The subtracter 104 subtracts the lossy decoded audio signal from the input audio signal delayed by the delay-correcting unit 103, thus generating a residual signal. The lossless-enhance encoder unit 105 performs lossless compression on the residual signal to generate an enhanced stream. The stream-combining unit 106 combines the core stream and the enhanced stream to generate a scalable lossless stream.

FIG. 2 schematically shows the configuration of an audio-data decoding apparatus 110 that is designed for use in combination with the audio-data encoding apparatus 100 described above. As shown in FIG. 2, the audio-data decoding apparatus 110 includes a stream-dividing unit 111, a lossy-core decoder unit 112, a lossless-enhance decoder unit 113, and an adder 114.

In the audio-data decoding apparatus 110, the stream-dividing unit 111 divides the input scalable lossless stream into a core stream and an enhanced stream. The lossy-core decoder unit 112 decodes the core stream, generating a decoded audio signal that is a lossy PCM signal. Meanwhile, the lossless-enhance decoder unit 113 decodes the enhanced stream to generate a residual signal. The adder 114 adds the residual signal to the lossy audio signal on the same time axis to generate a decoded audio signal that is a lossless PCM signal. This decoded audio signal is output from the audio-data decoding apparatus 110.

FIG. 3 schematically shows a configuration that the lossy-core encoder unit 101 may have in the audio-data encoding apparatus 100. As shown in FIG. 3, the lossy-core encoder unit 101 may include a band division filter 121, a sine-wave-signal extracting unit 122, a time-frequency transform unit 123, a bit allocation unit 124, and a multiplexer unit 125.

In the lossy-core encoder unit 101, the band division filter 121 divides an input audio signal into a plurality of frequency bands. The sine-wave-signal extracting unit 122 extracts sine-wave signals from the time signals of the frequency-bands and supplies parameters for constituting the sine-wave signals to the multiplexer unit 125. The time-frequency transform unit 123 performs modified discrete cosine transform (MDCT) on the time signals of the respective frequency bands, from which sine waves have been extracted. The unit 123 therefore converts these time signals to spectral signals of the respective frequency bands. The bit allocation unit 124 allocates bits to the spectral signals to generate quantized spectral signals. The multiplexer unit 125 combines the parameters for constituting the sine-wave signals and the quantized spectral signals to generate a core stream.

FIG. 4 schematically shows a configuration that the lossy-core decoder unit 102 may have in the audio-data encoding apparatus 100 described above. Note that the lossy-core decoder unit 112 provided in the audio-data decoding apparatus 110 may have the same configuration as the lossy-core decoder unit 102. As shown in FIG. 4, the lossy-core decoder unit 102 includes a demultiplexer unit 131, a sine-wave-signal reconstructing unit 132, a spectral-signal reconstructing unit 133, a frequency-time converting unit 134, a gain control unit 135, a sine-wave-signal adding unit 136, and a band-synthesizing filter 137.

In the lossy-core decoder unit 102, the demultiplexer unit 131 receives the core stream and divides the stream into parameters for constituting the sine-wave signals and quantized spectral signals. The sine-wave-signal reconstructing unit 132 reconstructs sine-wave signals from the parameters for constituting the sine-wave signals. The spectral-signal reconstructing unit 133 decodes the quantized spectral signals to generate spectral signals of frequency bands. The frequency-time transform unit 134 performs inverse MDCT (IMDCT) on the spectral signals, converting these signals to time signals of the frequency bands. The gain control unit 135 adjusts the gain of each time signal. The sine-wave-signal adding unit 136 adds a sine-wave signal to the time signal that has been adjusted in gain. The band-synthesizing filter 137 performs band synthesis on the time signals of frequency bands to generate a decoded lossy audio signal.

SUMMARY OF THE INVENTION

Sound-quality standards have been formulated for the signals decoded by most decoders that decode lossy streams. In other words, most decoders of this type have to be designed to satisfy the sound-quality standards.

Hitherto, a core stream has been decoded to generate and decode an enhanced stream, even at the time of generating and decoding a scalable lossless stream that is generally lossless-compressed but contains a lossy-compressed data part.

To decode the enhanced stream, lossy-core decoders (e.g., lossy-core decoder units 102 and 112 shown in FIGS. 1 and 2, respectively) have been used. Consequently, it is necessary for any audio-signal encoder and any audio-signal decoder, both designed to process scalable lossless streams, to take a longer time to generate and decode a lossless stream than the audio-signal encoder and the audio-signal decoder, both designed to process only lossless streams.

The present invention has been made in view of the foregoing. It is desirable to provide a method and apparatus for encoding audio data and a method and apparatus for decoding audio data, which can generate and decode, respectively, scalable lossless streams and which can shorten the time necessary to generate and decode lossless streams.

According to an embodiment of the present invention, there is provided an audio-data encoding apparatus (method) which includes: a core-stream encoding means for (step of) dividing an input audio signal into a plurality of frequency bands, performing time-frequency transform on the signals of the frequency bands to generate spectral signals, and performing lossy compression on the spectral signals to generate a core stream; a core-stream decoding means for (step of) decoding only the spectral signals of a specified frequency band in the core stream to generate a decoded signal; a subtracting means for (step of) subtracting the decoded signal from the input audio signal to generate a residual signal; an enhanced-stream encoding means for (step of) performing lossless compression on the residual signal to generate an enhanced stream; and a stream-combining means for (step of) combining the core stream and the enhanced stream to generate a scalable lossless stream.

According to an embodiment of the present invention, there is also provided an audio-data decoding apparatus (method) which includes: a stream-dividing means for (step of) dividing a scalable lossless stream into a core stream and an enhanced stream, the scalable lossless stream having been generated by combining the core stream and the enhanced stream, the core stream having been obtained by dividing an input audio signal into a plurality of frequency bands, performing time-frequency transform on the signals of the frequency bands to generate spectral signals, and performing lossy compression on the spectral signals, the enhanced stream having been obtained by performing lossless compression on a residual signal generated by subtracting the decoded signal from the input audio signal; a first core-stream decoding means for (step of) decoding spectral signals of all frequency bands to generate a lossy decoded audio signal; a second core-stream decoding means for (step of) decoding only the spectral signals of a specified frequency band in the core stream to generate a decoded signal; an enhanced-stream decoding means for (step of) decoding the enhanced stream to generate the residual signal; and an adding means for (step of) adding the residual signal to the decoded signal to generate a lossless decoded audio signal.

According to an embodiment of the present invention, there is also provided an audio-data decoding apparatus (method) which includes: a stream-dividing means for (step of) dividing a scalable lossless stream into a core stream and an enhanced stream, the scalable lossless stream having been generated by combining the core stream and the enhanced stream, the core stream having been obtained by dividing an input audio signal into a plurality of frequency bands, performing time-frequency transform on the signals of the frequency bands to generate spectral signals, and performing lossy compression on the spectral signals, the enhanced stream having been obtained by performing lossless compression on a residual signal generated by subtracting the decoded signal from the input audio signal; a core-stream decoding means for (step of) switching either for decoding spectral signals of all frequency bands to generate a lossy decoded audio signal, or decoding only the spectral signals of a specified frequency band to generate a decoded signal; an enhanced-stream decoding means for (step of) decoding the enhanced stream to generate the residual signal; and an adding means for (step of) adding the residual signal to the decoded signal to generate a lossless decoded audio signal.

In the method and apparatus for encoding audio data and the method and apparatus for decoding audio data, each according to the present invention, only the spectral signals of a specified frequency band are decoded in order to generate and decode an enhanced stream. Hence, the time necessary for generating and decoding the enhanced stream can be shortened.

DETAILED DESCRIPTION OF THE PREFERRED EMBODIMENTS

Embodiments of the present invention will be described, with reference to the accompanying drawings.

First Embodiment

Figure 5:
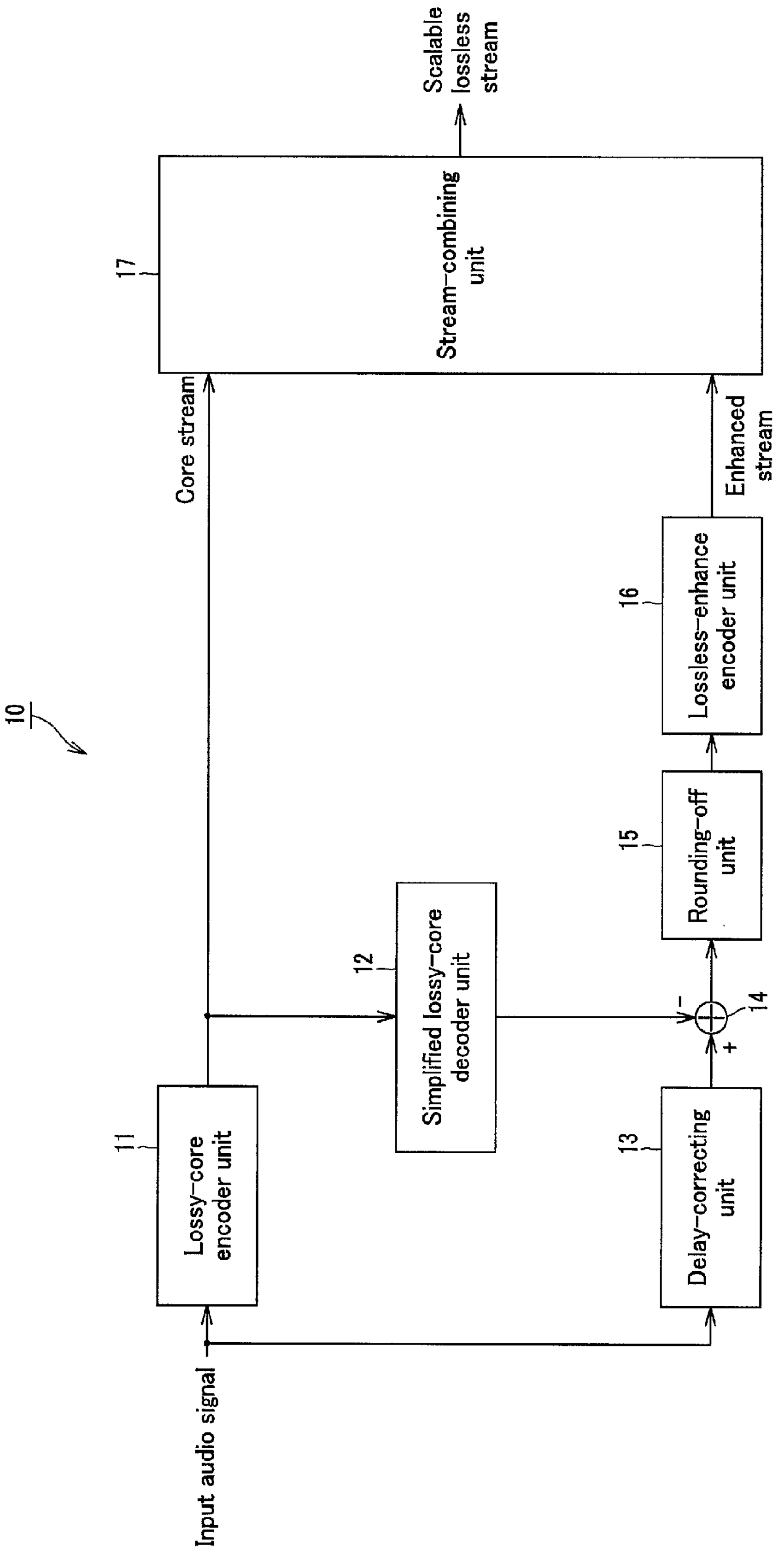
FIG. 5 is a diagram schematically showing an audio-data encoding apparatus according to a first embodiment of the present invention.

FIG. 5 shows an audio-data encoding apparatus according to the first embodiment of the present invention. As shown in FIG. 5, the audio-data encoding apparatus 10 includes a lossy-core encoder unit 11, a simplified lossy-core decoder unit 12, a delay-correcting unit 13, a subtracter 14, a rounding-off unit 15, a lossless-enhance encoder unit 16, and a stream-combining unit 17.

Figure 1:
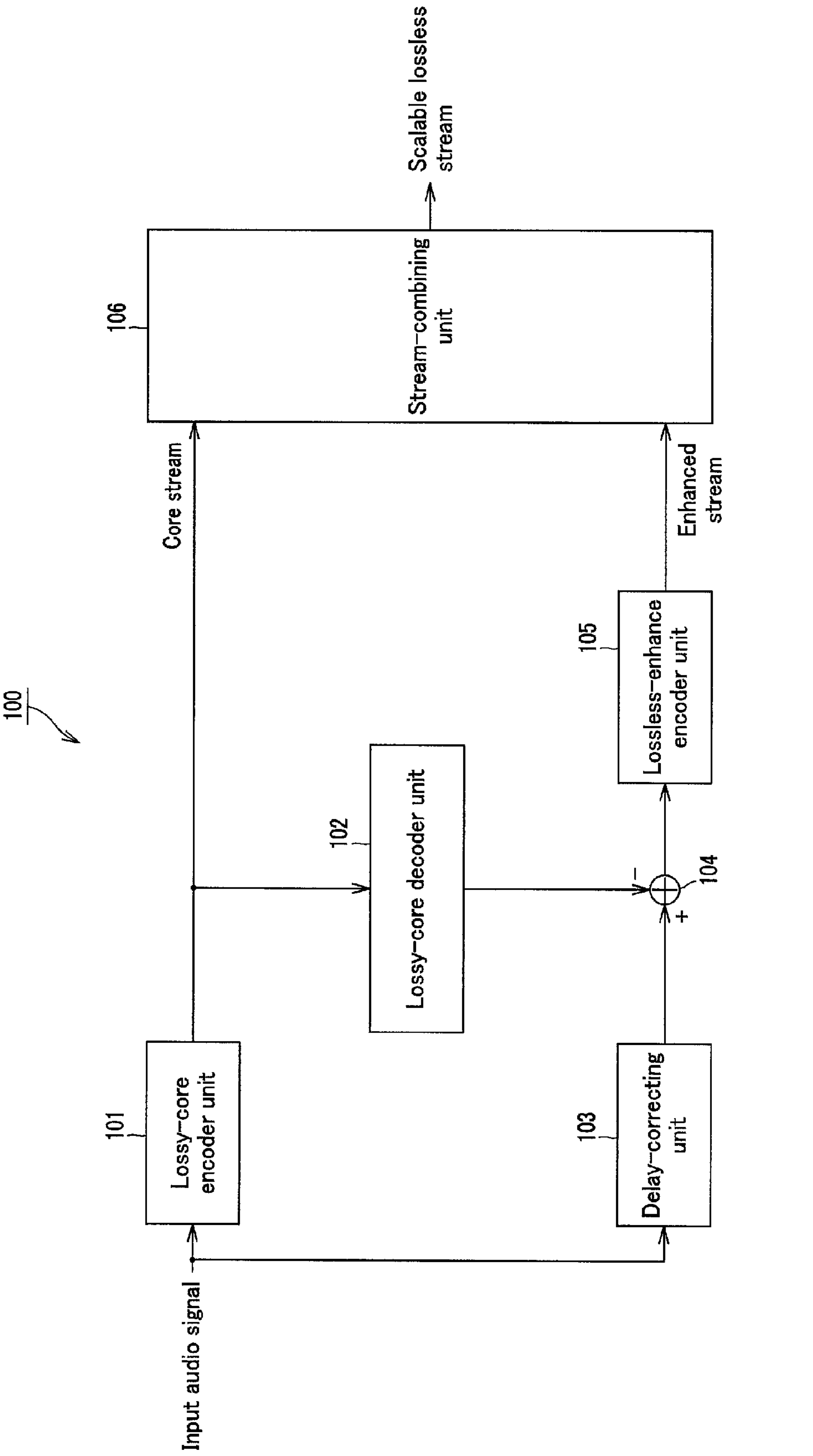
FIG. 1 is a diagram schematically showing an audio-data encoding apparatus used in the past.
Figure 2:
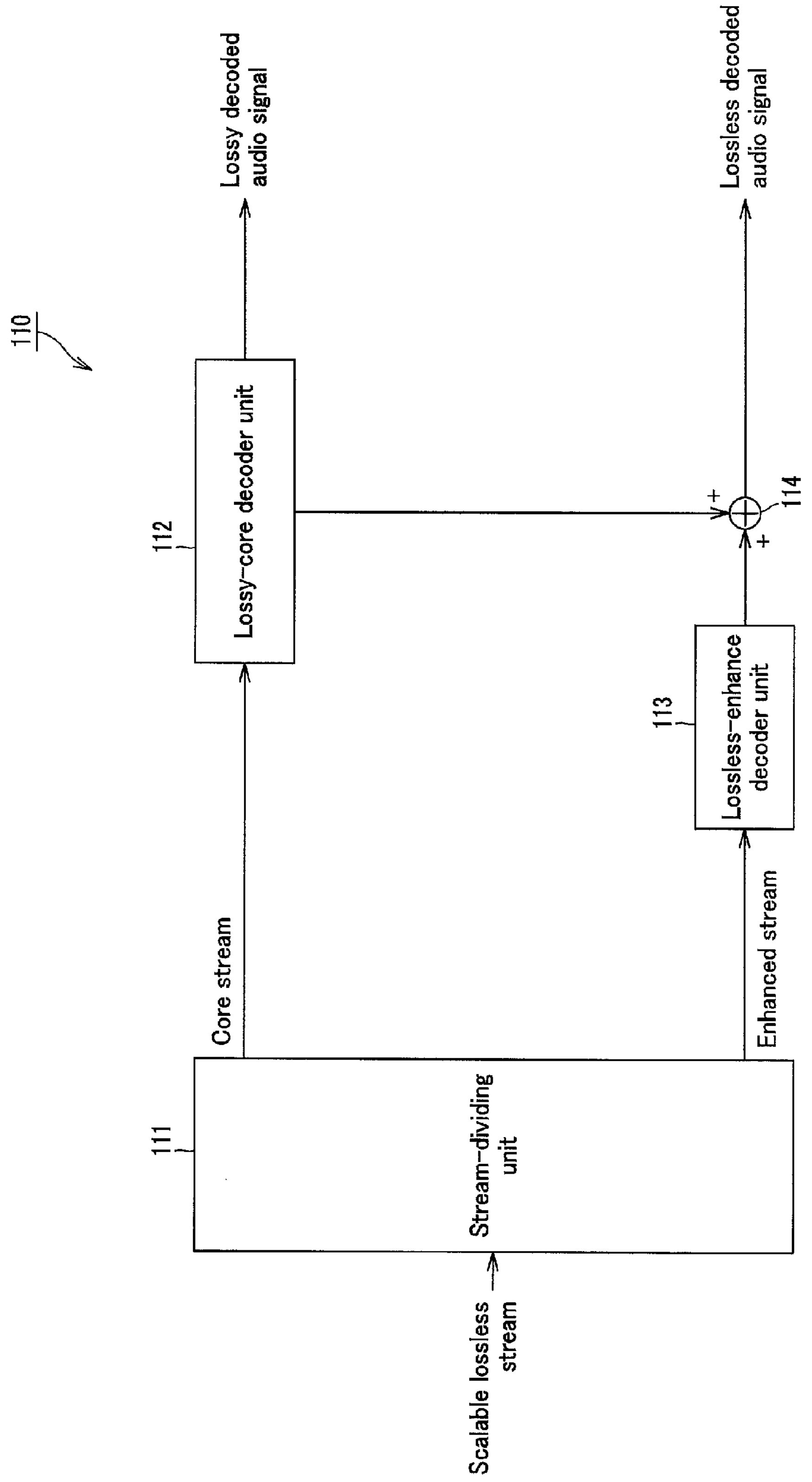
FIG. 2 is a diagram schematically showing an audio-data decoding apparatus used in the past.
Figure 3:
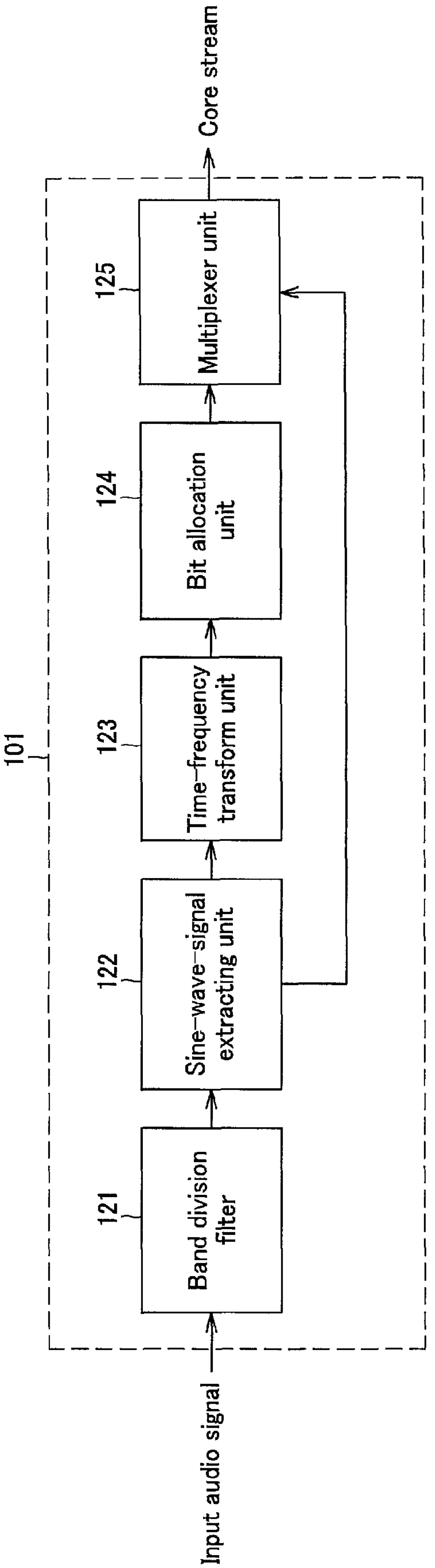
FIG. 3 is a diagram schematically showing the lossy-core encoder unit incorporated in the audio-data encoding apparatus used in the past.

In the audio-data encoding apparatus 10, the lossy-core encoder unit 11, which has such a structure as shown in FIG. 3, performs lossy compression on an input audio signal that is a pulse-code modulated (PCM) signal to generate a core stream. The core stream is composed of parameters for constituting sine-wave signals and quantized spectral signals. The lossy-core encoder unit 11 supplies the core stream to the simplified lossy-core decoder unit 12 and the stream-combining unit 17.

The simplified lossy-core decoder unit 12 receives the core stream from the lossy-core encoder unit 11 and decodes it to generate a lossy decoded audio signal, which is supplied to the subtracter 14. The simplified lossy-core decoder unit 12 performs a process that is simpler than the process of the lossy-core decoder unit shown in FIG. 4 which is used in the past. This point will be explained later.

The subtracter 14 subtracts the lossy decoded audio signal from the input audio signal that the delay-correcting unit 13 has delayed by the delay time in the simplified lossy-core decoder unit 12. Thus, the subtracter 14 generates a residual signal, which is supplied to the rounding-off unit 15.

The rounding-off unit 15 rounds off the residual signal to a signal having the same number of bits as the input audio signal and the decoded signal. The rounded residual signal is supplied to the lossless-enhance encoder unit 16. More precisely, if the input audio signal and the decoded signal are n-bit signals, the residual signal, i.e., the result of the subtraction, is n+1 bit signal. Nonetheless, the rounding-off unit 15 changes the residual signal to an n-bit signal. The process the rounding-off unit 15 performs will be described later.

Figure 6:
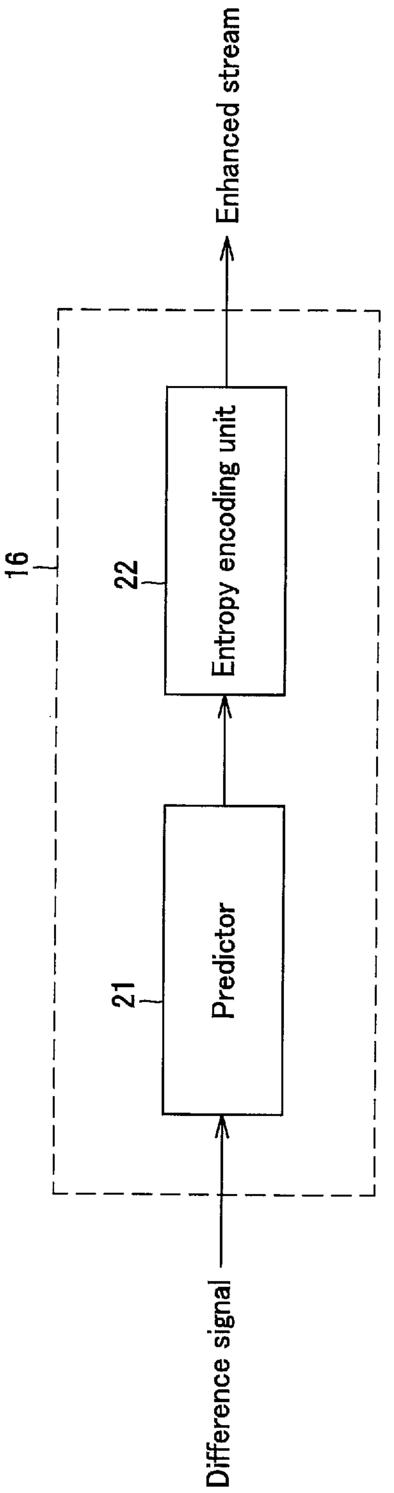
FIG. 6 is a diagram depicting the internal configuration of the lossless enhance encoder provided in the audio-data encoding apparatus of FIG. 5.

The lossless-enhance encoder unit 16 performs lossless compression on the residual signal to generate an enhanced stream. The enhanced stream is supplied to the stream-combining unit 17. As shown in FIG. 6, the lossless-enhance encoder unit 16 has a predictor 21 and an entropy encoding unit 22. The predictor 21 generates a prediction parameter from the residual signal by using a linear predictive coding (LPC) and a difference signal representing the difference between the residual signal and a prediction signal. The entropy encoding unit 22 performs, for example, Golomb-Rice encoding on the prediction parameter and the difference signal to generate an enhanced stream.

The stream-combining unit 17 combines the core stream and the enhanced stream to generate a scalable lossless stream. The scalable lossless stream is output from the audio-data encoding apparatus 10 to an external apparatus.

Figure 7:
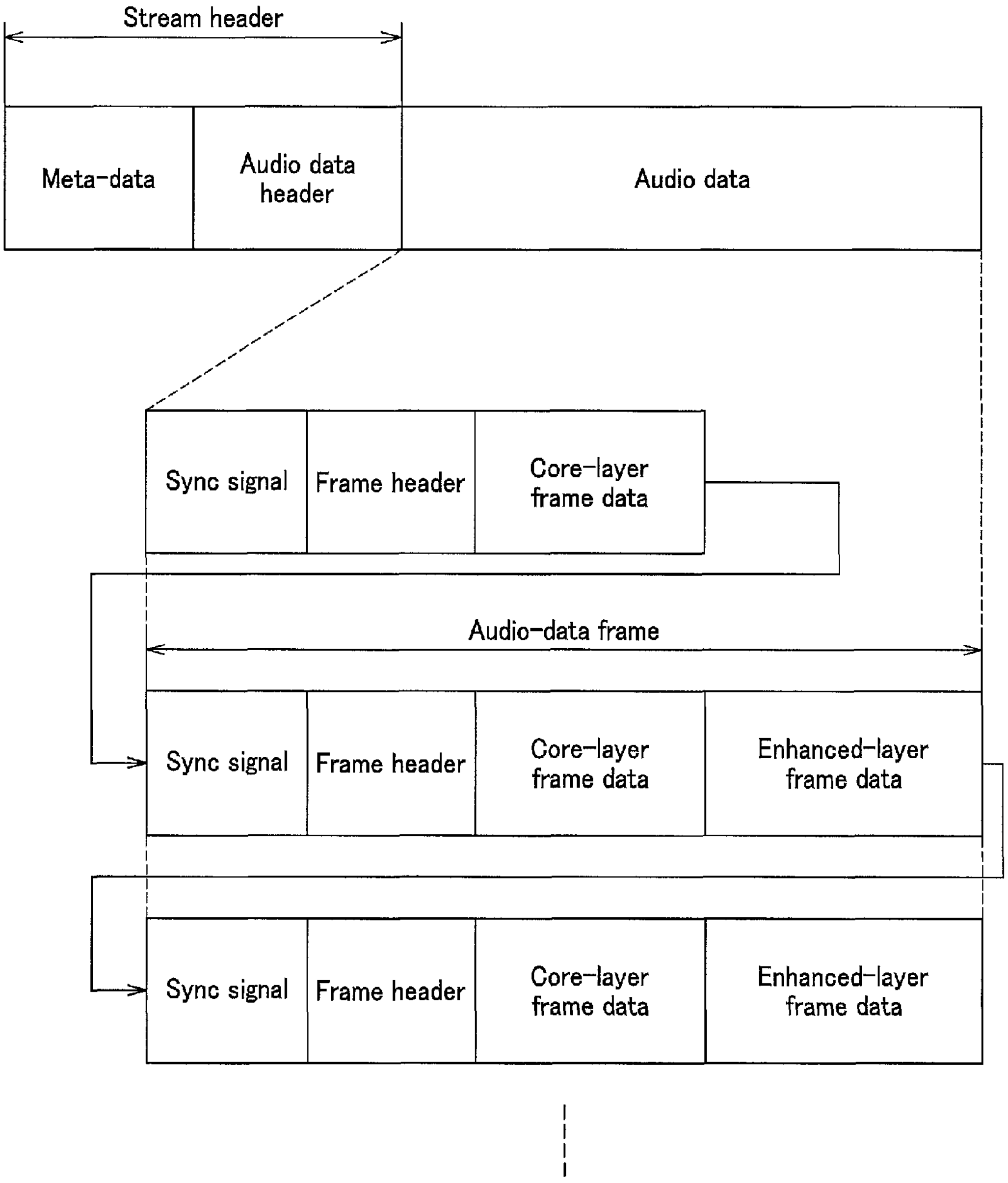
FIG. 7 is a diagram illustrating the structure of a scalable lossless stream generated in the apparatus of FIG. 5.

FIG. 7 illustrates the structure of the scalable lossless stream generated. As shown in FIG. 7, the scalable lossless stream is composed of a stream header and audio data. The audio data follows the stream header. The stream header is composed of meta-data and an audio data header. The audio data is composed of a plurality of audio-data frames. All audio-data frames, but the first audio-data frame, are composed of a sync signal, a frame header, core-layer frame data, and enhanced-layer frame data. The first audio-data frame has no enhanced-layer frame data because of the delay made in the lossy-core encoder unit 11 and the simplified lossy-core decoder unit 12.

In the audio-data encoding apparatus 10, an audio signal is processed in process unit of 1024 samples or 2048 samples. In whichever process unit the audio signal is processed depends on the process unit in which the lossy-core encoder unit 11 processes data. That is, if the lossy-core encoder unit 11 processes data in process unit of 1024 samples, the audio-data encoding apparatus 10 processes data in process unit of 1024 samples, too. If the lossy-core encoder unit 11 processes data in process unit of 2048 samples, the audio-data encoding apparatus 10 processes data in process unit of 2048 samples, too.

Figure 8:
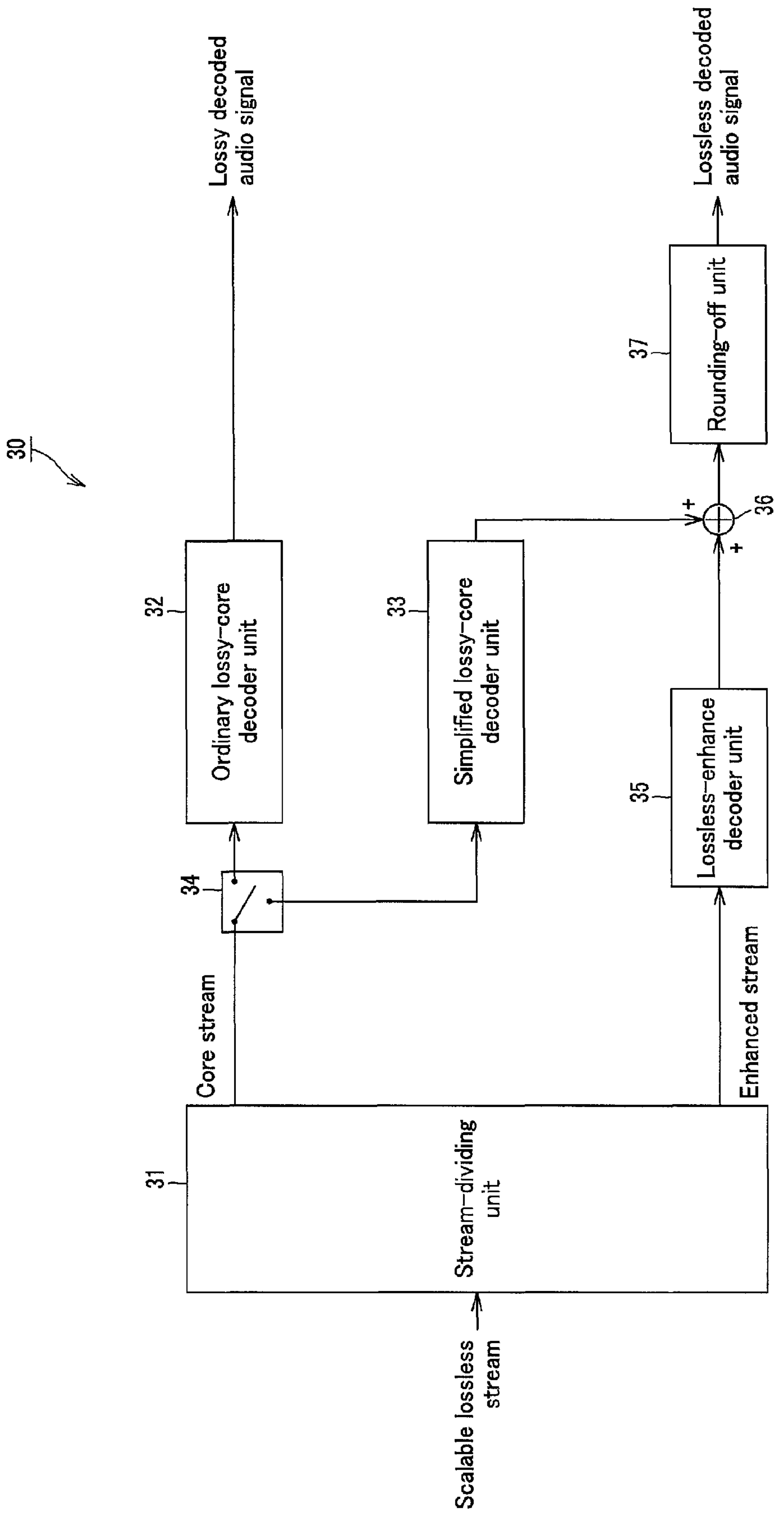
FIG. 8 is a diagram schematically showing an audio-data decoding apparatus according to the first embodiment of the present invention.

FIG. 8 schematically shows an audio-data decoding apparatus according to the first embodiment of this invention. As shown in FIG. 8, the audio-data decoding apparatus 30 includes a stream-dividing unit 31, an ordinary lossy-core decoder unit 32, a simplified lossy-core decoder unit 33, a switch 34, a lossless-enhance decoder unit 35, an adder 36, and a rounding-off unit 37.

In the audio-data decoding apparatus 30, the stream-dividing unit 31 receives a scalable lossless stream and divides it into a core stream and an enhanced stream. The core stream is supplied to the ordinary lossy-core decoder unit 32 or the simplified lossy-core decoder unit 33. At the same time, the enhanced stream is supplied to the lossless-enhance decoder unit 35. Which lossy-core decoder unit, the unit 32 or the unit 33, receives the core stream depends on how the switch 34 has been operated. To be more specific, the core stream is supplied to the ordinary lossy-core decoder unit 32 in order to generate a lossy decoded audio signal or to the simplified lossy-core decoder unit 33 in order to generate a lossless decoded audio signal.

Figure 4:
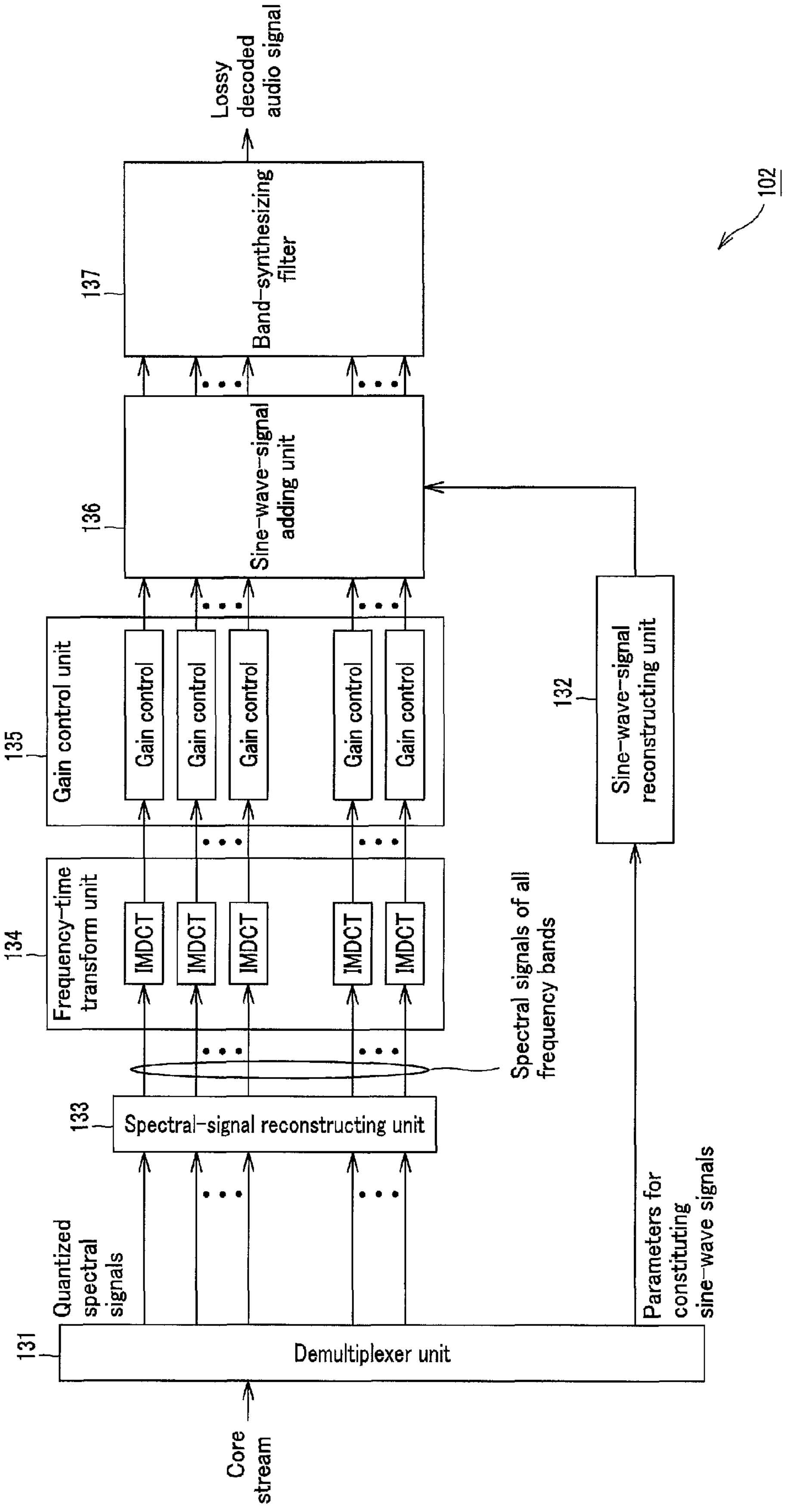
FIG. 4 is a diagram schematically showing the lossy-core decoder unit incorporated in the audio-data encoding apparatus used in the past.

The ordinary lossy-core decoder unit 32 has such a configuration as illustrated in FIG. 4. This unit 32 receives a core stream from the stream-dividing unit 31 and decodes it to generate a decoded audio signal that is a lossy PCM signal. The lossy PCM signal is output to an external apparatus.

The simplified lossy-core decoder unit 33 receives a core stream from the stream-dividing unit 31 and decodes it to generate a decoded signal. The decoded signal is supplied to the adder 36. The simplified lossy-core decoder unit 33 performs a simpler process than the lossy-core decoder unit shown in FIG. 4 which is used in the past. This point will be explained later.

Figure 9:
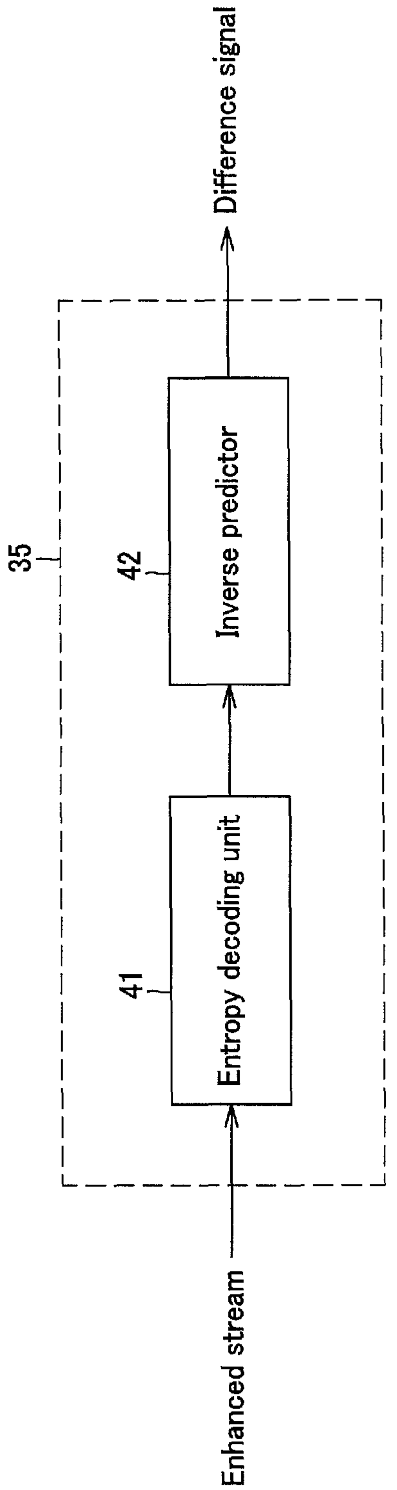
FIG. 9 is a diagram depicting the internal configuration of the lossless enhance encoder unit provided in the audio-data decoding apparatus of FIG. 8.

The lossless-enhance decoder unit 35 receives an enhanced stream from the stream-dividing unit 31 and decodes it to generate a residual signal. The residual signal is supplied to the adder 36. As shown in FIG. 9, the lossless-enhance decoder unit 35 has an entropy decoding unit 41 and an inverse predictor 42. The entropy decoding unit 41 decodes the enhanced stream obtained by means of Golomb-Rice encoding. The inverse predictor 42 performs, for example, LPC synthesis, the decoded enhanced stream to generate a residual signal.

The adder 36 adds the residual signal to the decoded signal on the same time axis to generate a decoded audio signal that is a lossless PCM signal. The lossless PCM signal is supplied to the rounding-off unit 37.

The rounding-off unit 37 rounds off the lossless decoded audio signal to a signal having the same number of bits of the residual signal and the decoded signal. The round-off unit 37 therefore generates a lossy decoded audio signal, which is output to an external apparatus. If the residual signal and the decoded signal are n-bit signals, the lossless decoded audio signal, i.e., the output of the adder 36, will be n+1 bit signal. The rounding-off unit 37 rounds off this lossless decoded audio signal to n bit signal. The process of rounding off the lossless decoded audio signal by the round-off unit 37 will be described later.

The processes performed in the rounding-off units 15 and 37 will be explained.

If the input audio signal and the decoded signal are n-bit signals, the residual signal, i.e., the result of subtraction, will be n+1 bit signal. The rounding-off unit 15 converts this residual signal to an n-bit signal. The residual signal can thereby undergo entropy encoding efficiently. The audio-data decoding apparatus 30 can therefore be easily implemented in fixed-point LSIs in which data is processed in units of n bits or less bits.

The method of rounding off the signal to an n-bit signal in the rounding-off unit 15 is, for example as follows:

$$Z=R-2M(R\leq M)$$

$$Z=R+2M(R<-M)$$

where R is the residual signal (i.e., signed n+1 bit integer), Z is the rounded residual signal (i.e., signed n-bit integer), and $M=2^{n-1}$.

The residual signal may be expressed as a two's complement. Then, Z can be found merely by acquiring the lower n bits of R as a signed integer.

The rounding-off unit 37 performs a process of rounding off a n+1 bit lossless decoded audio signal, in the same way as described above.

The case where n=16 bits and M=32768 will be explained as an example.

If the audio-data encoding apparatus 10 receives an input audio signal X and outputs a decoded signal Y and that X=32000 and Y=−6000, the residual signal R generated by the subtracter 14 is R=X−Y=38000 (binary notation: 1001 0100 0111 0000). The rounding-off unit 15 extracts the lower 16 bits of R and converts them to a signed integer. Thus, the residual signal is easily rounded off to a rounded residual signal Z; Z=−27536 (binary notation: 1001 0100 0111 0000).

In the audio-data decoding apparatus 30, the lossless decoded audio signal generated by the adder 36 is the sum of the residual signal Z and the decoded signal Y, i.e., Z+Y=−33536 (binary notation: 10111 1101 0000 0000). The rounding-off unit 37 extracts the lower 16 bits of the sum, thus restoring an audio signal X, i.e., X=32000 (binary notation: 0111 1101 0000 0000), which is identical to the input audio signal.

Figure 11:
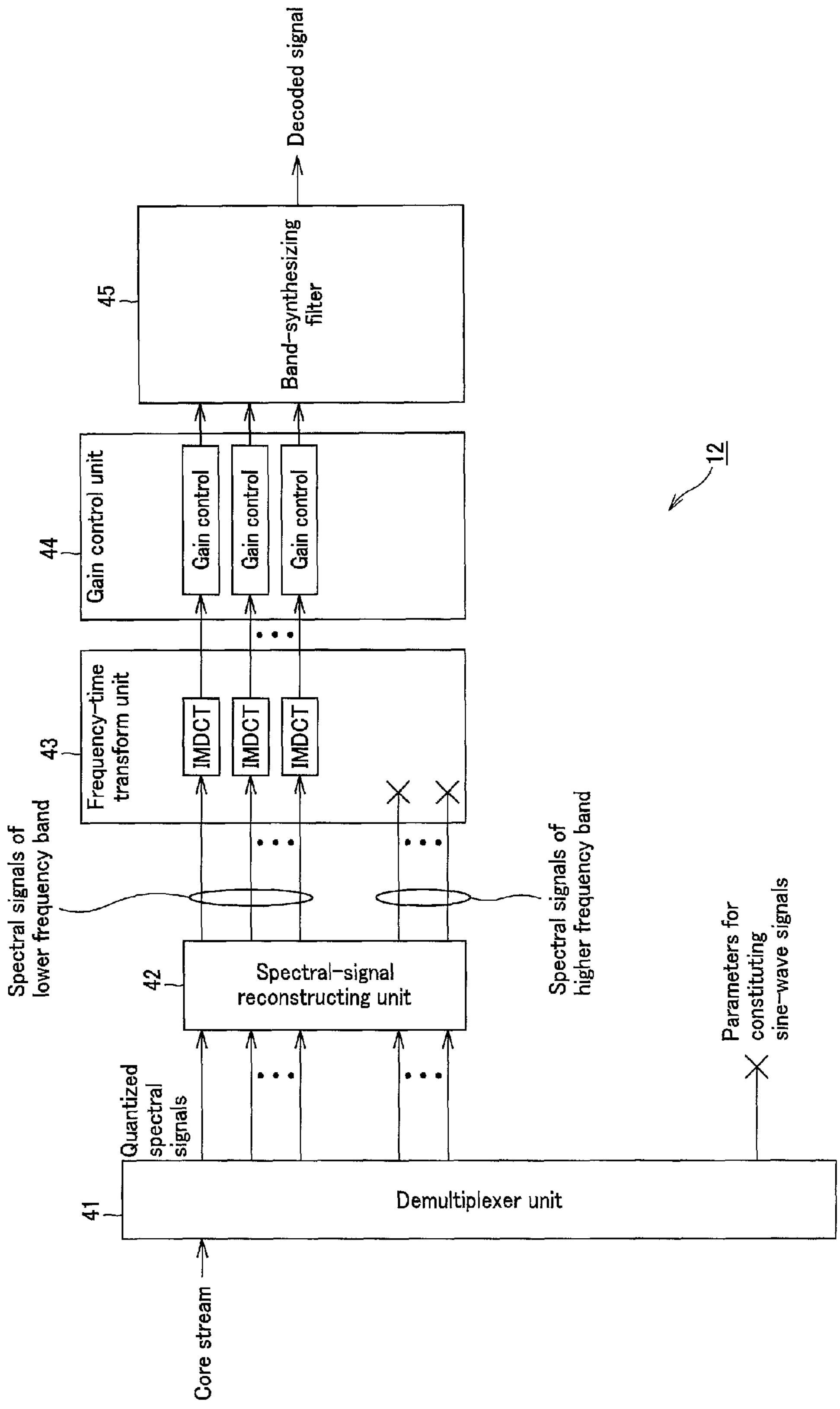
FIG. 11 is a diagram schematically showing the simplified lossy core decoder unit used in the audio-data encoding apparatus of FIG. 1.

FIG. 11 schematically shows the simplified lossy-core decoder unit 12 used in the audio-data encoding apparatus 10. Note that the simplified lossy-core decoder unit 33 incorporated in the audio-data decoding apparatus 30 has the same configuration as the simplified lossy-core decoder unit 12. As shown in FIG. 11, the simplified lossy-core decoder unit 12 includes a demultiplexer unit 41, a spectral-signal reconstructing unit 42, a frequency-time converting unit 43, a gain control unit 44, and a band-synthesizing filter 45.

In the simplified lossy-core decoder unit 12, the demultiplexer unit 41 receives a core stream and divides the stream into parameters for constituting sine-wave signals and quantized spectral signals. The demultiplexer unit 41 supplies only the quantized spectral signals to the spectral-signal reconstructing unit 42.

The spectral-signal reconstructing unit 42 receives the quantized spectral signals from the demultiplexer unit 41 and decodes them to generate spectral signals of frequency bands. The spectral signals are supplied to the frequency-time transform unit 43.

The frequency-time transform unit 43 performs IMDCT on only the spectral signals of a specified band, for example, a lower frequency bands, supplied from the spectral-signal reconstructing unit 42. The unit 43 converts these spectral signals to time signals. The frequency-time transform unit 43 supplies the time signals of the specified band to the gain control unit 44.

The gain control unit 44 adjusts the gain of each time signal of the specified band, supplied from the frequency-time converting unit 43. The time signals adjusted the gain are supplied to the band-synthesizing filter 45.

The band-synthesizing filter 45 performs band synthesis on the time signals of the specified band supplied from the gain control unit 44, generating decoded signal.

In the simplified lossy-core decoder units 12 and 33 according to this embodiment, only the spectral signals of the specified frequency band are decoded as described above. They do not reconstruct sine-wave signals. If the results of the data-processing have fractional values that are less than the resolution of a data-holding register (not shown), no rounding-off processes are performed. Thus, the process in the simplified lossy-core decoder units 12 and 33 is lighter than in the lossy-core decoder units used in the past.

The audio-data encoding apparatus 10 and the audio-data decoding apparatus 30, which have the simplified lossy-core decoder units 12 and 33, respectively, can encode and decode enhanced streams in a shorter time than in the apparatuses used in the past.

Second Embodiment

The simplified lossy-core decoder units 12 and 33 according to the first embodiment perform simple processes. Hence, it is not generate a lossy decoded audio signal satisfying the prescribed sound-quality standards. It is therefore necessary for the audio-data decoding apparatus 30 to have the ordinary lossy-core decoder unit 32, in addition to the simplified lossy-core decoder unit 33, in order to generate lossy decoded audio signals. Having two types of lossy-core decoders, the audio-data decoding apparatus 30 has larger data-storage capacity. This inevitably increases the manufacturing cost of the audio-data decoding apparatus 30.

To solve this problem, an ordinary lossy-core decoder unit and a simplified lossy-core decoder unit are integrated in an audio-data decoding apparatus according to the second embodiment of this invention.

Figure 12:
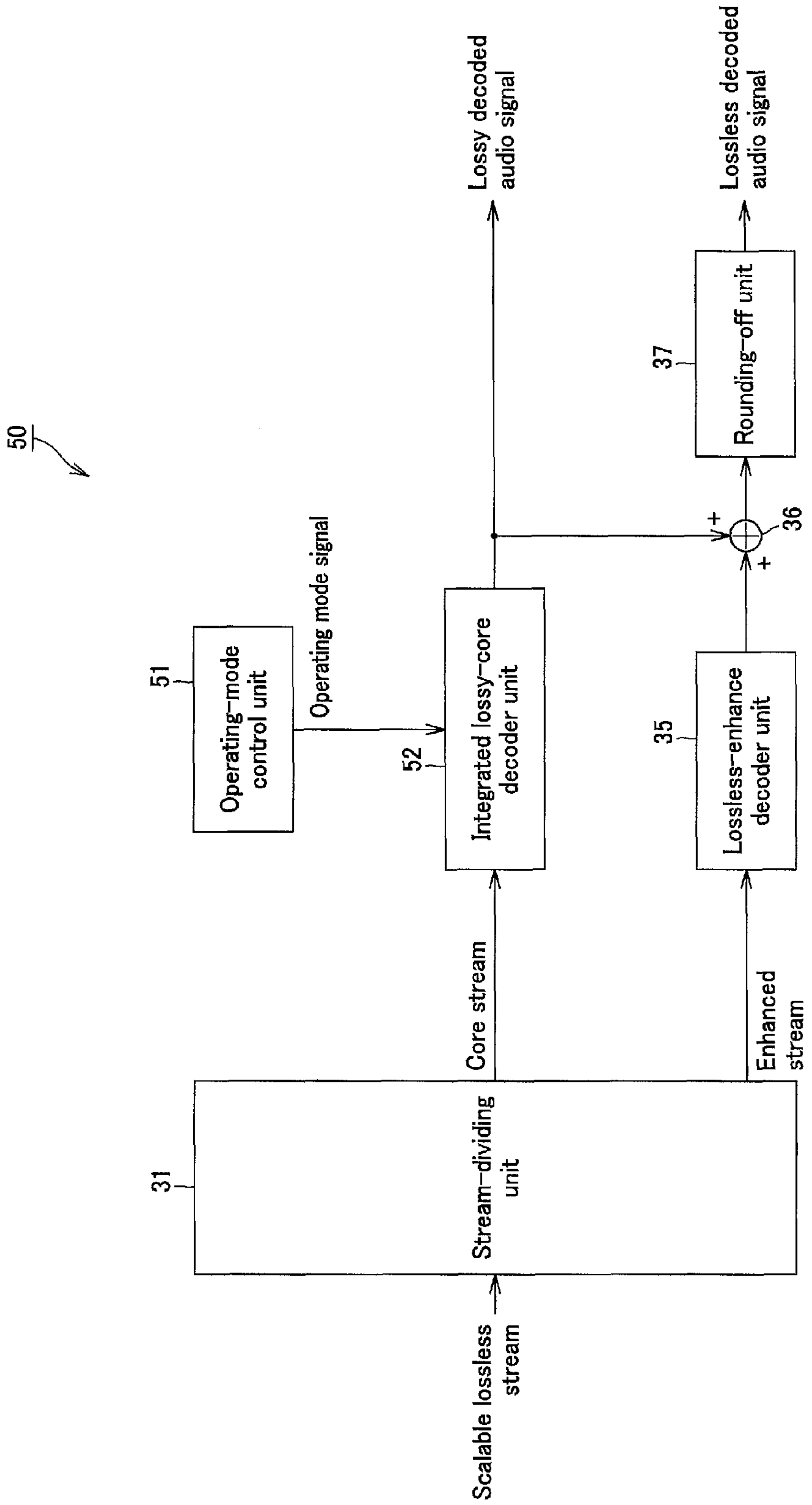
FIG. 12 is a diagram schematically showing an audio-data decoding apparatus according to a second embodiment of the present invention.

FIG. 12 shows an audio-data decoding apparatus 50 according to the second embodiment of the present invention. The components similar to those of the audio-data decoding apparatus 30 shown in FIG. 8 are designated at the same reference numbers and will not be described in detail. As shown in FIG. 12, the audio-data decoding apparatus 50 includes a stream-dividing unit 31, an operating-mode control unit 51, an integrated lossy-core decoder unit 52, a lossless-enhance decoder unit 35, an adder 36, and a rounding-off unit 37.

In the audio-data decoding apparatus 50, the operating-mode control unit 51 supplies an operating-mode signal to the integrated lossy-core decoder unit 52. The operating-mode signal represents a mode of outputting a lossy decoded audio signal or a lossless decoded audio signal to an external apparatus.

In accordance with the operating-mode signal supplied from the operating-mode control unit 51, the integrated lossy-core decoder unit 52 performs an ordinary process to generate a lossy decoded audio signal (as the ordinary lossy-core decoder unit 32 shown in FIG. 8) or a simplified process to generate a decoded signal (as the simplified lossy-core decoder unit 33 shown in FIG. 8). If the integrated lossy-core decoder unit 52 performs an ordinary process, it outputs the lossy decoded audio signal to the external apparatus. If it performs a simplified process, it supplies the decoded signal to the adder 36.

Figure 13:
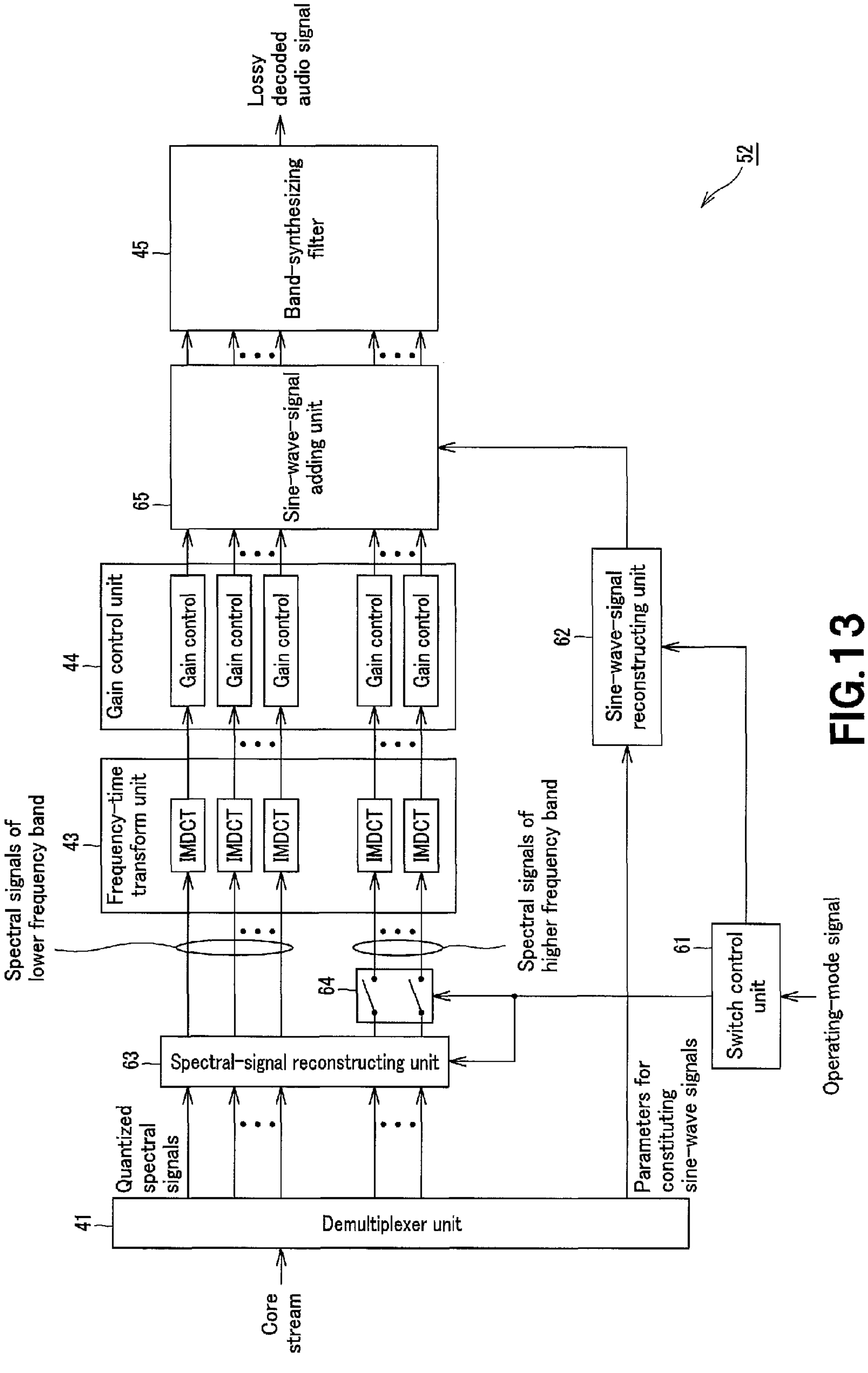
FIG. 13 is a diagram schematically showing the integral lossy-core decoder unit incorporated in the audio-data decoding apparatus of FIG. 12.

FIG. 13 schematically shows the integral lossy-core decoder unit 52. The components similar to those of the simplified lossy-core decoder unit 33 shown in FIG. 11 are designated at the same reference numerals and will not be described in detail. As shown in FIG. 13, the integral lossy-core decoder unit 52 includes a demultiplexer unit 41, a switch control unit 61, a sine-wave-signal reconstructing unit 62, a spectral-signal reconstructing unit 63, a switch 64, a frequency-time converting unit 43, a gain control unit 44, a sine-wave-signal adding unit 65, and a band-synthesizing filter 45.

In the integral lossy-core decoder unit 52, the switch control unit 61 receives an operating-mode signal from the operating-mode control unit 51. In accordance with the operating-mode signal, the unit 52 supplies switching signals to the sine-wave-signal reconstructing unit 62, spectral-signal reconstructing unit 63 and switch 64, switching the operation of the sine-wave-signal reconstructing unit 62 and that of the spectral-signal reconstructing unit 63, and turn on or off the switch 64.

The sine-wave-signal reconstructing unit 62 has its operating mode switched in accordance with a switching signal supplied from the switch control unit 61. More precisely, the sine-wave-signal reconstructing unit 62 reconstructs a sine-wave signal to generate a lossless decoded audio signal and the sine-wave-signal reconstruction unit 62 is not using the parameters for constituting sine-wave signals to a lossy decoded audio signal.

The spectral-signal reconstructing unit 63 receives quantized spectral signals from the demultiplexer unit 41 and decodes it to generate spectral signals of frequency bands. To generate spectral signals, the spectral-signal reconstructing unit 63 switches from an inverse quantization table to another, in accordance with a switching signal supplied from the switch control unit 61. The process the spectral-signal reconstructing unit 63 performs will be described later in detail.

The switch 64 is turned on or off by a switching signal supplied from the switch control unit 61. More specifically, the switch 64 is turned off so that a lossy decoded audio signal is generated, and is turned on so that a lossless decoded audio signal is generated. Hence, in order to generate a lossy decoded audio signal, only spectral signals of a specified band, e.g., a lower frequency band, are supplied to the next-stage component. In order to generate a lossless decoded audio signal, spectral signals of all frequency bands are supplied to the next-stage component.

When the sine-wave-signal adding unit 65 receives a sine-wave signal from the sine-wave-signal reconstructing unit 62, it adds the sine-wave signal to the time signal of each frequency band.

Figure 14:
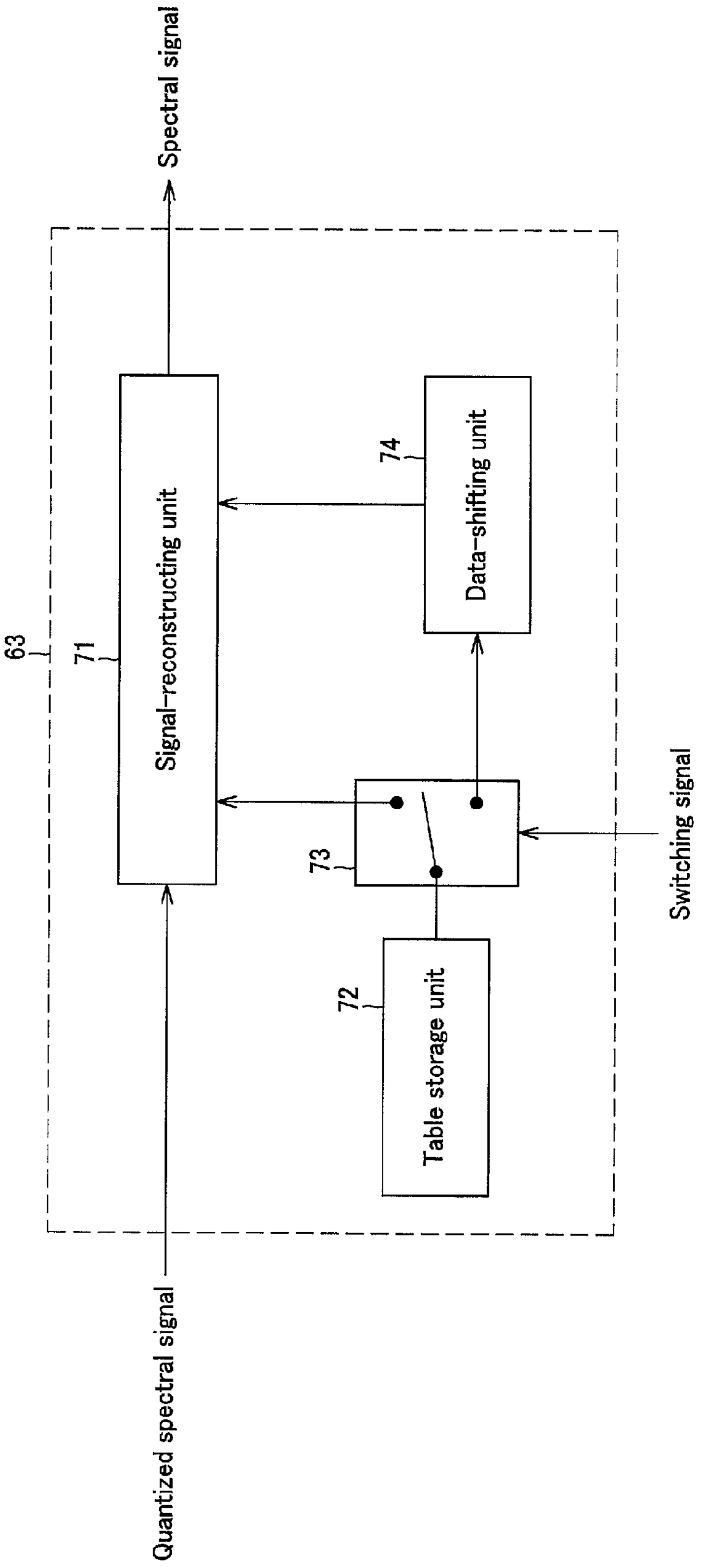
FIG. 14 is a diagram schematically showing the spectral-signal reconstructing unit provided in the integral lossy-core decoder unit.

FIG. 14 shows the spectral-signal reconstructing unit 63. As shown in FIG. 14, the spectral-signal reconstructing unit 63 includes a signal-reconstructing unit 71, a table storage unit 72, a switch 73, and a data-shifting unit 74.

The signal-reconstructing unit 71 performs inverse quantization on spectral signals, by using either a 32-bit coefficient table supplied from the table storage unit 72 or a 24-bit coefficient table supplied from the data-shifting unit 74. Which coefficient table, the table supplied from the table storage unit 72 or the table supplied from the data-shifting unit 74, is supplied to the unit 71 is determined by the operation of the switch 73. To be more specific, the 32-bit coefficient table stored in the table storage unit 72 is supplied to the data-shifting unit 74 in order to generate a lossy decoded audio signal or to the signal-reconstructing unit 71 in order to generate a lossless decoded audio signal. In the data-shifting unit 74 the coefficient data of the 32-bit coefficient table are sifted to the right by 8 bits to generate a 24-bit coefficient table. The 24-bit coefficient table is supplied to the signal-reconstructing unit 71. Thus, the coefficient tables are commonly possessed in the spectral-signal reconstructing unit 63. This saves the storage area of the memory used.

Figure 15A:
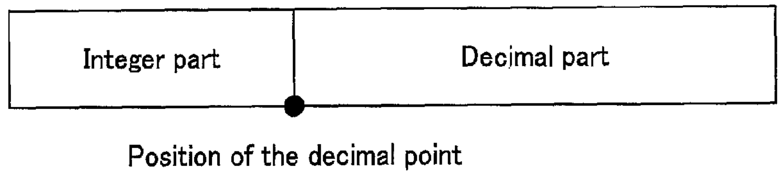
FIGS. 15A and 15B are conceptual diagrams illustrating the relation between a fixed-point operation and the position of the decimal point.
Figure 15B:
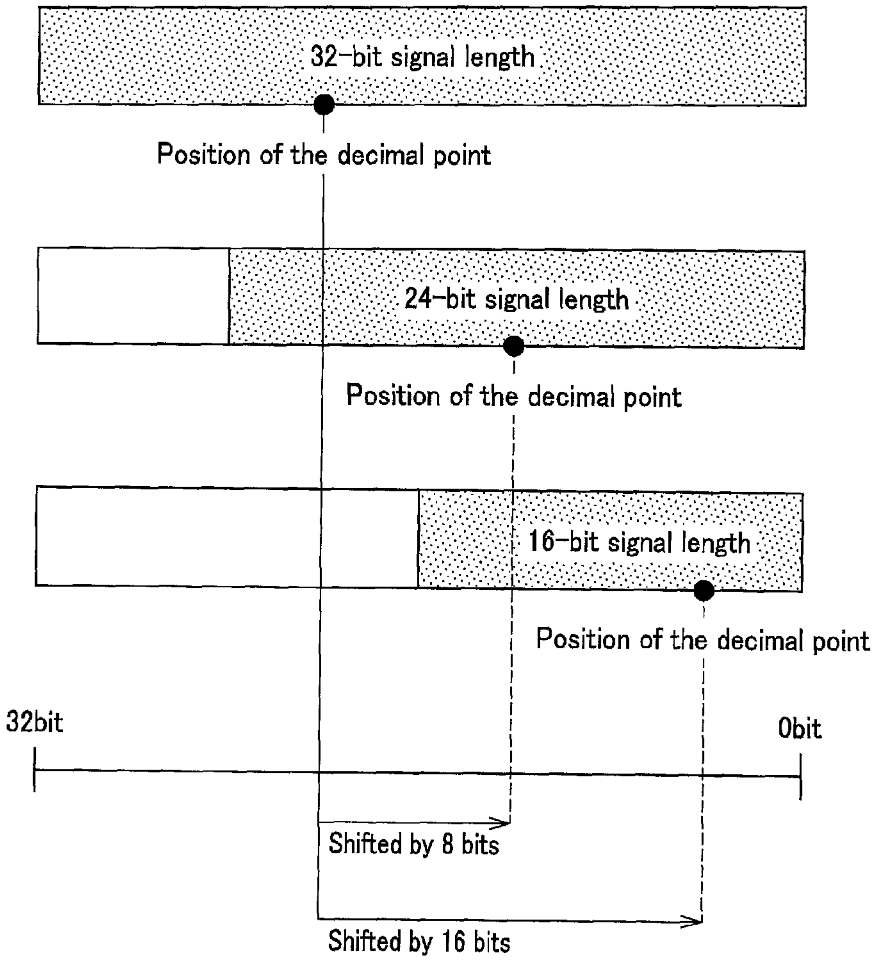

In the spectral-signal reconstructing unit 63, not only the coefficient tables, but also source codes are commonly possessed, on the basis of the basic idea of fixed-point operation. FIGS. 15A and 15B illustrate the relation between a fixed-point operation and the position of the decimal point. As described above, in the spectral-signal reconstructing unit 63, the 24-bit coefficient table is used to generate a lossy decoded audio signal, and the 32-bit coefficient table is used to generate a lossless decoded audio signal. Due to the difference in signal-word length, the position of the decimal point changes, inevitably changing the decimal value. Nonetheless, the accuracy of the integer does not change if the decimal point is at a position represented by 0 bit or more bits. That is, the accuracy of operation can be controlled by changing the position of the decimal point. The spectral-signal reconstructing unit 63 utilizes this feature of fixed-point operation, whereby the source codes are commonly possessed.

As indicated above, an ordinary lossy-core decoder unit and a simplified lossy-core decoder unit are integrated in the integral lossy-core decoder unit 52. Therefore, the audio-data decoding apparatus 50 does not have to have two types of lossy-core decoder units. Hence, some storage area can be saved in the audio-data decoding apparatus 50. In practice, the storage area can be reduced to about half the area that is otherwise necessary (to about 55%) by integrating the ordinary and simplified lossy-core decoder units.

The present invention is not limited to the embodiments described above. Various changes and modifications can, of course, be made without departing from the scope and spirit of the invention.

For example, the invention is not limited to such hardware configurations as the embodiments described above. Any process can be performed by making a central processing unit (CPU) execute computer programs. In this case, the computer programs can be provided in the form of a recorded medium or acquired through a transmission network such as the Internet.

It should be understood by those skilled in the art that various modifications, combinations, sub-combinations and alterations may occur depending on design requirements and other factors insofar as they are within the scope of the appended claims or the equivalents thereof.

What is claimed is:

1. An audio-data encoding apparatus comprising a lossy-core encoder unit configured to (1) receive an input audio signal and (2) perform lossy compression on the input audio signal to generate a core stream, the input audio signal being a pulse code modulated signal;

a decoder unit configured to receive the core stream and generate a lossy signal;

a delay-correcting unit configured to receive the input audio signal and generate a delayed audio signal with a delay equal to the time the decoder unit takes to generate the lossy signal;

a subtraction unit configured to (1) receive as inputs the delayed audio signal and the lossy signal and (2) generate a signed residual signal by subtracting the lossy signal from the delayed audio signal;

a rounding-off unit configured to (1) receive as an input the residual signal and (2) generate a rounded residual signal by dropping the sign bit of the residual signal and using the most significant bit of the residual signal as the sign bit of the rounded residual signal;

a lossless-enhance encoder unit configured to (1) receive as an input the rounded residual signal and (2) generate an enhanced stream; and a stream-combining unit configured to (1) receive as inputs the core stream generated by the lossy-core encoder unit and the enhanced steam generated by the lossless-enhance encoder unit and (2) generate a scalable lossless stream, wherein, to generate the lossy signal, the decoder unit divides the core stream into a plurality of frequency bands, performs time-frequency transform on the signals of the frequency bands to generate spectral signals, and decodes only the spectral signals of a specified subset of the frequency bands to output a decoded signal, and the lossless-enhance encoder unit includes (1) a predictor unit which generates a prediction parameter from the rounded residual signal using a linear predictive coding and a difference signal representing the difference between the rounded residual signal and a prediction signal, and (2) an entropy encoding unit that performs encoding of the prediction parameter and the difference signal to generate the enhanced stream.

2. The audio-data encoding apparatus according to claim 1, wherein:

the lossy-core encoder unit performs time-frequency transform on components of each frequency band from which a sine-wave signal has been extracted, to generate a spectral signal, quantizes the spectral signal to generate a quantized spectral signal, and combines the quantized spectral signal and the information of the sine-wave signal to generate the core stream, and the decoder unit performs inverse quantization on the quantized spectral signal to generate spectral signal of frequency bands, performs frequency-time conversion transform on only the spectral signal of the specified frequency band, and performs band synthesis to generate the decoded signal.

3. The audio-data encoding apparatus according to claim 1, wherein the decoder unit decodes only the spectral signals of a lower frequency band in the core stream.

4. An audio-data encoding method comprising:

a core-stream encoding step of (1) receiving, with a lossy-core encoder unit, an input audio signal, (2) performing lossy compression on the input audio signal to generate a core stream, and (3) outputting the core stream;

a core-stream decoding step of (1) receiving the core stream from the lossy-core encoder unit with a decoder unit, (2) dividing the core stream into a plurality of frequency bands, (3) performing time-frequency transform on the signals of the frequency bands to generate respective spectral signals, and (4) output a decoded signal by decoding only the spectral signals of a specified subset of the frequency bands and without using parameters for constituting sine waves;

a delay step of (1) receiving the input audio signal with a delay unit and (2) generating a delayed input audio signal with a delay equal to the time taken by the decode to process the core stream and generate the decoded signal;

a subtracting step of (1) receiving the decode signal and the delayed input audio signal with a delay unit and (2) subtracting the decoded signal from the delayed input audio signal to generate a residual signal with a sign bit;

a rounding off step of (1) receiving the residual signal with a rounding off unit and (2) generating a rounded off residual signal by dropping the sign bit of the residual signal and using the most significant bit of the residual signal as the sign bit of the rounded off residual signal;

an enhanced-stream encoding step of performing lossless compression on the rounded off residual signal to generate an enhanced stream; and a combining step of receiving with a stream combining unit the core stream from the lossless-encoder unit and the enhanced stream from the which also is provided to the stream-combining unit, wherein, the enhanced-stream encoding step includes a first step of generating a prediction parameter from the residual signal using a linear predictive coding and a difference signal representing the difference between the residual signal and a prediction signal, and a second step of encoding the prediction parameter and the difference signal to generate the enhanced stream.

5. An audio-data decoding apparatus comprising:

a stream-dividing unit configured to divide a scalable lossless stream into a core stream and an enhanced stream, the scalable lossless stream having been generated by the method set forth in claim 4;

a core stream decoding unit configured to generate a decoded signal by decoding only the spectral signals of a specified frequency band in the core stream and without using parameters for constituting sine waves;

an lossless-enhance decoding unit configured to decode the enhanced stream to generate the residual signal;

an addition unit which adds the decoded signal and the residual signal on the same time axis to generate a lossless decoded audio signal that is a lossless pulse code modulated signal with a sign bit; and a rounding-off unit which receives the lossless decoded audio signal and generates a lossless audio signal having the same number bits as the residual signal and the lossless decoded signal by dropping the sign bit of the decoded audio signal and using the most significant bit as the sign bit of the lossless decoded audio signal, wherein, the decoding unit includes an entropy decoding unit that decodes the enhanced steam and an inverse predictor that performs linear predictive coding on the output of the entropy decoding unit to generate the residual signal.

6. The audio-data decoding apparatus according to claim 5, wherein:

the core stream has been obtained by performing time-frequency transform on the signals of frequency bands from which a sine-wave signal has been extracted to generate a spectral signal, by quantizing the spectral signal to generate a quantized spectral signal, and by combining the quantized spectral signal and the information of the sine-wave signal, and the core stream decoder unit performs inverse quantization on the quantized spectral signal to generate spectral signal of frequency bands, performs frequency-time transform on only the spectral signal of the specified frequency band, and performs band synthesis, thereby generating the decoded signal.

7. The audio-data decoding apparatus according to claim 5, wherein to generate the decoded signal, the core steam decoding unit decodes only the spectral signals of a lower frequency band in the core stream.

8. The audio-data decoding apparatus of claim 5, further comprising:

a second core steam decode unit that receives the core stream generated by the stream-dividing unit and generates a lossy decoded audio signal using spectral signals of all frequency bands and parameters for constituting sine waves; and a switch interposed between the steam-dividing unit and the core decode unit and the second core stream decode unit to selectively pass the core stream to them.

9. The audio-data decoding apparatus of claim 5, wherein:

the decode unit is configured to selectively operate in first and second modes;

in the first mode, the core stream decode unit is configured to generate the decoded audio signal using only the specified subset of spectral signals; and in the second mode, the core stream decode unit is configured to generate a lossy decoded audio signal using the spectral signals for all of the frequency bands and parameters for constituting sine waves.

10. An audio-data decoding method comprising:

a stream-dividing step of dividing a scalable lossless stream into a core stream and an enhanced stream, the scalable lossless stream having been generated by the method set forth in claim 4;

a core stream decoding step of generating a decoded signal by decoding only the spectral signals of a specified frequency band in the core stream and without using parameters for constituting sine waves;

an enhanced stream decoding step of decoding the enhanced stream to generate the residual signal;

an adding step of adding the residual signal to the decoded signal on the same time axis to generate a lossless decoded audio signal, the lossless decoded audio signal being a pulse code modulated signal with a sign bit;

a rounding off step of rounding off the lossless decoded audio signal to generate a lossless audio signal having the same number bits as the residual signal and the decoded signal by dropping the sign bit of the lossless decoded signal and using the most significant bit of the lossless decoded audio signal as the sign bit of the lossless audio signal, wherein, the enhanced steam decoding step includes an entropy decoding step of decoding the enhanced steam and an inverse predictor step of using linear predictive coding on the output of the entropy decoding step to generate the residual signal.

* * * * *